(12) United States Patent
Ren (10) Patent No.: US 8,350,265 B2
(45) Date of Patent: Jan. 8, 2013

(54) TFT-LCD ARRAY SUBSTRATE AND MANUFACTURING METHOD THEREOF

(75) Inventor: Zuxing Ren, Beijing (CN)

(73) Assignee: Beijing BOE Optoelectronics Technology Co., Ltd., Beijing (CN)

(*) Notice: Subject to any disclaimer, the term of this patent is extended or adjusted under 35 U.S.C. 154(b) by 99 days.

(21) Appl. No.: 12/858,724

(22) Filed: Aug. 18, 2010

(65) Prior Publication Data

US 2011/0042676 A1 Feb. 24, 2011

(30) Foreign Application Priority Data

Aug. 19, 2009 (CN) .......................... 2009 1 0090518

(51) Int. Cl.
H01L 33/08 (2010.01)
(52) U.S. Cl. ........... 257/59; 257/E33.001; 257/E33.053; 345/92
(58) Field of Classification Search .................... 257/59, 257/E33.001, E33.053; 345/92
See application file for complete search history.

(56) References Cited

U.S. PATENT DOCUMENTS

2006/0250537 A1 11/2006 Lee
2008/0278424 A1* 11/2008 Kim et al. ...................... 345/92

FOREIGN PATENT DOCUMENTS

CN 1858640 A 11/2006
CN 201072484 Y 6/2008

* cited by examiner

Primary Examiner — Long Pham
(74) Attorney, Agent, or Firm — Ladas & Parry LLP (57) ABSTRACT

A thin film transistor liquid crystal display (TFT-LCD) array substrate and a method of manufacturing a TFT-LCD array substrate are provided in the invention. The TFT-LCD array substrate comprises a plurality of gate lines and a plurality of data lines formed on a substrate. A plurality of pixel regions are defined by the gate lines and the data lines. A pixel electrode, a first thin film transistor for controlling the charge of the pixel electrode and a second thin film transistor for controlling the pre-charge of the pixel electrode are formed in each pixel region.

7 Claims, 6 Drawing Sheets

TFT-LCD ARRAY SUBSTRATE AND MANUFACTURING METHOD THEREOF

BACKGROUND

Embodiments of the present invention relate to a thin film transistor liquid crystal display (TFT-LCD) array substrate and a manufacturing method thereof.

Thin film transistor liquid crystal displays (TFT-LCDs) have the advantages of small volume, low energy consumption, low radiation and the like, and thus have prevailed in the flat plate display market. A TFT-LCD mainly comprises an array substrate, a color filter substrate and a liquid crystal layer sandwiched between the array substrate and the color filter substrate. Gate lines, data lines, pixel electrodes and thin film transistors are formed on the array substrate. Each pixel electrode is controlled by a corresponding thin film transistor. The pixel electrode is charged when the thin film transistor is turned on. In addition, when the thin film transistor is turned off, the voltage of the pixel electrode sustains until recharging at the time of next scanning.

In order to prevent the liquid crystal layer from being damaged, the liquid crystal display generally is driven in a manner of polarity reversal. The polarity reversal manner mainly comprises: frame reversal, row reversal and point reversal. For example, in the point reversal, the polarity of each pixel electrode is opposite to that of the adjacent pixel electrode within a frame, and the polarity of each pixel electrode is reversed in the next frame so that the polarity of each pixel electrode is still opposite to that of the adjacent pixel electrode. Since each pixel electrode has opposite polarities in adjacent two frames, the voltage drop between adjacent two frames is relatively large. In this case, it is difficult to charge and discharge the pixel electrode, the charge-and-discharge time of the pixel electrode is relatively long and the energy consumption is relatively large.

SUMMARY

According to one embodiment of the invention, a thin film transistor liquid crystal display (TFT-LCD) array substrate is provided. The TFT-LCD array substrate comprises a plurality of gate lines and a plurality of data lines formed on a substrate. A plurality of pixel regions are defined by the gate lines and the data lines. A pixel electrode, a first thin film transistor for controlling the charge of the pixel electrode and a second thin film transistor for controlling the pre-charge of the pixel electrode are formed in each pixel region.

According to another embodiment of the invention, a method of manufacturing a TFT-LCD array substrate is provided. The method comprises:

Step 11 of depositing a first metal film on a substrate, forming a gate line, a first gate electrode and a second gate electrode by patterning the first metal film, wherein the first gate electrode and the second gate electrode are connected with the gate line and respectively provided in pixel regions on both sides of the gate line;

Step 12 of depositing a gate insulating layer, a semiconductor film, a doped semiconductor film and a second metal film, and forming a first active layer, a second active layer, a data line, a source electrode, a drain electrode, a first connection electrode and a second connection electrode by patterning the stack of the second metal film, the doped semiconductor film and the semiconductor film;

Step 13 of depositing a pssivation layer, and forming a first via hole, a second via hole, a third via hole and a fourth via hole by patterning the passivation layer, wherein the first via hole in the passivation layer is provided at the drain electrode, the second via hole of the pssivation layer is provided at the first connection electrode or the second connection electrode, the third via hole of the passivation layer is provided at an end portion of the first connection electrode, and the fourth via hole in the passivation layer is provided at an end portion of the second connection electrode; and Step 14 of depositing a transparent conductive film, and forming a pixel electrode and a third connection electrode by patterning the transparent conductive film, wherein the pixel electrode is connected with the drain electrode through the first via hole in the passivation layer and connected with the first connection electrode or the second connection electrode through the second via hole in the passivation layer, the first connection electrode and the second connection electrode in adjacent two pixel regions are connected with each other by the third connection electrode through the third via hole and the fourth via hole in the passivation layer.

According to still another embodiment of the invention, a method of manufacturing a TFT-LCD array substrate is provided. The method comprises:

Step 21 of depositing a first metal film on a substrate, and forming a gate line, a first gate electrode and a second gate electrode by patterning the first metal film, wherein the first gate electrode and the second gate electrode are connected with the gate line and respectively provided in pixel regions on both sides of the gate line;

Step 22 of sequentially depositing a gate insulating layer, a semiconductor film and a doped semiconductor film, and forming a first active layer and a second active layer by patterning the stack of the doped semiconductor film and the semiconductor film;

Step 23 of depositing a second metal layer, and forming a data line, a source electrode, a drain electrode and a first TFT channel region by patterning the second metal layer;

Step 24 of depositing an insulating layer;

Step 25 of depositing a third metal film, and forming a first connection electrode, a second connection electrode and a second TFT channel region by patterning the third metal film;

Step 26 of depositing a passivation layer, and forming a first via hole and a second via hole by patterning the passivation layer, wherein the first via hole in the passivation layer is provided at the drain electrode, and the second via hole in the passivation layer is provided at the first connection electrode or the second connection electrode; and Step 27 of depositing a transparent conductive film, and forming a pixel electrode by patterning the transparent conductive film, wherein the pixel electrode is connected with the drain electrode through the first via hole in the passivation layer and connected with the first connection electrode or the second connection electrode through the second via hole in the passivation layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

The embodiments of the invention will be described in detail with reference to the accompanying drawings.

Figure 1:
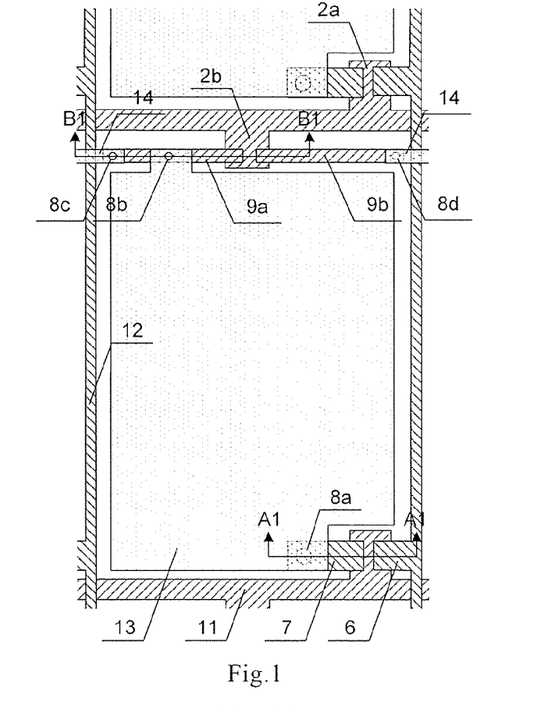
FIG. 1 is a plan view showing a first embodiment of a TFT-LCD array substrate according to the invention.
Figure 2:
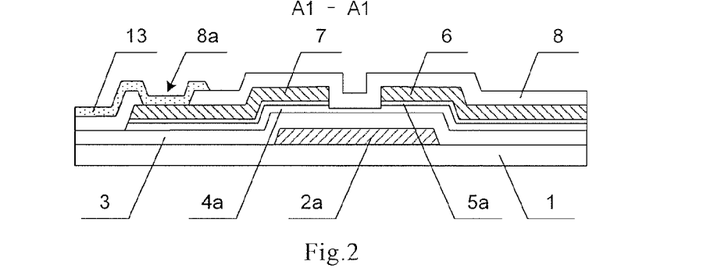
FIG. 2 is a sectional view taken along line A1-A1 in FIG. 1.
Figure 3:
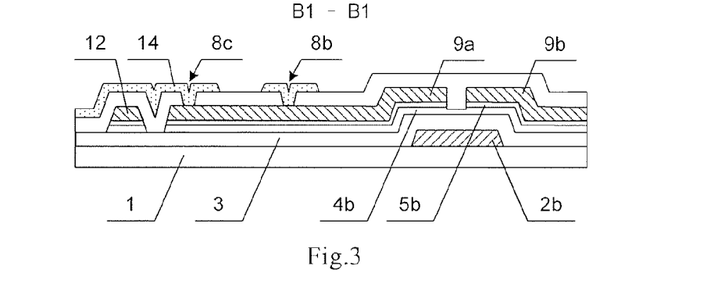
FIG. 3 is a sectional view taken along line B1-B1 in FIG. 1.

FIG. 1 is a plan view showing a first embodiment of a TFT-LCD array substrate according to the invention, FIG. 2 is a sectional view taken along line A1-A1 in FIG. 1, and FIG. 3 is a sectional view taken along line B1-B1 in FIG. 1.

As shown in FIG. 1 to FIG. 3, the main body of the TFT-LCD array substrate according to this embodiment comprises a plurality of gate lines 11, a plurality of data lines 12, a plurality of pixel electrode 13, a plurality of first thin film transistors and a plurality of second thin film transistors, all of which are formed on a substrate 1. One first thin film transistor, one second thin film transistor and one pixel electrode 13 are provided in each pixel region. The first thin film transistor and the second thin film transistor are connected with the gate line adjacent to the pixel electrode, respectively. The first thin film transistor is used as the operation switch to control the charge of the pixel electrode, the second thin film transistor is used as the discharge switch to control the pre-charge of the pixel electrode, and in this way, the charge-and-discharge time of the pixel electrode can be effectively shortened and the power consumption for driving the liquid crystal display using the array substrate can be effectively reduced.

In the TFT-LCD array substrate in this embodiment, in the first thin film transistor and the second thin film transistor which are connected with the n-th gate line 11, the first thin film transistor is provided in the pixel region in the n-th pixel row corresponding to the n-th gate line 11, and the second thin film transistor is provided in the pixel region in the (n+1)-th pixel row corresponding to the (n+1)-th gate line 11. The first thin film transistor is used to charge the pixel electrode in the n-th pixel row according to the ON signal supplied over the n-th gate line 11, and at the same time, the second thin film transistor is used to pre-charge the pixel electrode in the (n+1)-th pixel row according to the ON signal supplied over the n-th gate line 11. In other words, if the n-th pixel row is regarded as the current pixel row and the n-th gate line corresponding to the n-th pixel row is regarded as the current gate line, the (n−1)-th gate line corresponding to the (n−1)-th pixel row is regarded as the previous gate line, and in this case, in the first thin film transistor and the second thin film transistor which are provided in the pixel region in the n-th pixel row, the first thin film transistor is connected with the n-th gate line (the current gate line) corresponding to the n-th pixel row and used to charge the pixel electrode in the n-th pixel row according to the ON signal supplied over the n-th gate line 11, and the second thin film transistor is connected with the (n−1)-th gate line (the previous gate line) corresponding to the (n−1)-th pixel row and used to pre-charge the pixel electrode in the n-th pixel row according to the ON signal supplied from the (n−1)-th gate line 11. Therefore, each gate line is used as the operation gate line for the current pixel row as well as the pre-charge gate line for the next gate line.

Specifically, the TFT-LCD array substrate in this embodiment comprises one gate line 11, a first gate electrode 2a and a second gate electrode 2b on the substrate 1 corresponding to the gate line 11. The first gate electrode 2a and the second gate electrode 2b are connected with the gate line 11 and respectively provided in the pixel regions on both sides of the gate line 11. That is, if the first gate electrode 2a is provided in the pixel region in the n-th pixel row, the second gate electrode 2b is provided in the pixel region in the adjacent (n+1) pixel row. A gate insulating layer 3 is formed on the gate line 11, the first gate electrode 2a and the second gate electrode 2b and covers the entirety of the substrate 1. A first active layer (comprising a stack of a first semiconductor film 4a and a first doped semiconductor film 5a) and a second active layer (comprising a stack of a second semiconductor film 4b and a second doped semiconductor film 5b) are formed on the gate insulating layer 3. The first active layer is positioned over the first gate electrode 2a, while the second active layer is positioned over the second gate electrode 2b. A source electrode 6 and a drain electrode 7 are provided on the first active layer. One end of the source electrode 6 is positioned over the first gate electrode 2a, and the other end thereof is connected with the data line 12. One end of the drain electrode 7 is positioned over the first gate electrode 2a, and the other end thereof is connected with the pixel electrode 13. A first TFT channel region is formed between the source electrode 6 and the drain electrode 7. In the first TFT channel region, the first doped semiconductor film 5a is completely removed and the first semiconductor film 4a is partially etched in the thickness direction thereof so that the first semiconductor film 4a in this region is exposed. A first connection electrode 9a and a second connection electrode 9b are formed on the second active layer. One end of the first connection electrode 9a is positioned over the second gate electrode 2b, and the other end thereof is positioned at the edge on a side of the pixel region and adjacent to the data line 12 on this side. One end of the second connection electrode 9b is positioned over the second gate electrode 2b, and the other end thereof is positioned at the edge on another side of the pixel region and adjacent to the data line 12 on this side. A second TFT channel region is formed between the first connection electrode 9a and the second connection electrode 9b. In the second TFT channel region, the second doped semiconductor film 5b is completely removed and the second semiconductor film 4b is partially etched in the thickness direction thereof so that the second semiconductor film 4b in this region is exposed. In this way, the first gate electrode 2a, the first active layer, the source electrode 6 and the drain electrode 7 constitute the first thin film transistor as the operation switch, and the first thin film transistor is provided in the pixel region in the n-th pixel row; the second gate electrode 2b, the second active layer, the first connection electrode 9a and the second connection electrode 9b constitute the second thin film transistor as the charge switch, and the second thin film transistor is positioned in the pixel region in the adjacent (n+1) pixel row. A passivation layer 8 is formed on the above structures and covers the entirety of the substrate 1. A first via hole 8a in the passivation layer is provided at the drain electrode 7, a second via hole 8b in the passivation layer is provided at the first connection electrode 9a (or the second connection electrode 9b), a third via hole 8c in the passivation layer is provided at the end portion of the first gate electrode 9a in the proximity of the data line 12, and a fourth via hole 8d in the passivation layer is provided at the end portion of the second connection electrode 9b in the proximity of the data line 12. The pixel electrode 13 and a third connection electrode 14 are formed on the passivation layer 8. The pixel electrode 13 is formed in one pixel region. The drain electrode 7 of the first thin film transistor as the operation switch is connected with the pixel electrode 13 in the pixel region in the n-th pixel row through the first via hole 8a in the passivation layer. The first connection electrode 9a (or the second connection electrode 9b) is connected with the pixel electrode 13 in the pixel region in the adjacent (n+1) pixel row through the second via hole 8b in the passivation layer. The third connection electrode 14 is formed between adjacent two pixel regions in the same pixel row and connects the first connection electrode 9a and the second connection electrode 9b which are respectively provided in the adjacent pixel regions in the same pixel row through the third via hole 8c and the fourth via hole 8d in the passivation layer.

In the TFT-LCD array substrate of this embodiment, when the ON signal is supplied to the n-th gate line, the first thin film transistors and the second thin film transistors which are connected with the n-th gate line simultaneously begin to operate. The source electrode and the drain electrode of the first thin film transistor as the operation switch are electrically connected so that the pixel electrodes in the n-th pixel row corresponding to the n-th gate line are charged. At the same time, the first connection electrode and the second connection electrode of the second thin film transistor as the discharge switch are electrically connected so that the pixel electrodes in the (n+1)-th pixel row adjacent to the n-th pixel row are connected with each other, thus the voltage of each pixel electrode in the (n+1)-th pixel row reach a mean value and the mean value is in the middle segment between the current frame voltage and the next frame voltage of each pixel electrode, that is, each pixel electrode in the (n+1)-th pixel row is pre-charged. In this way, the voltage drop between the current frame and the next frame of each pixel electrode is shortened, and the large variation of voltage in the polarity reversal mode is eliminated. Thus, the charge-and-discharge time can be shortened and the power consumption can be decreased.

When the OFF signal is supplied to the n-th gate line and the ON signal is supplied to the (n+1)-th gate line, the first thin film transistors and the second thin film transistors which are connected with the n-th gate line are simultaneously turned off, and the first thin film transistors and the second thin film transistors which are connected with the (n+1)-th gate line simultaneously begin to operate so that the pixel electrodes in the (n+1)-th pixel row are charged and the pixel electrodes in the (n+2)-th pixel row are pre-charged.

FIG. 4 to FIG. 12 are schematic views showing the manufacture process of the first embodiment of the TFT-LCD array substrate according to the invention. Hereinafter, the described patterning process may comprise the processes of applying of photoresist, masking, exposing and developing of photoresist, etching, removing of remaining photoresist and the like. For example, positive photoresist is used as the above-mentioned photoresist.

Figure 4:
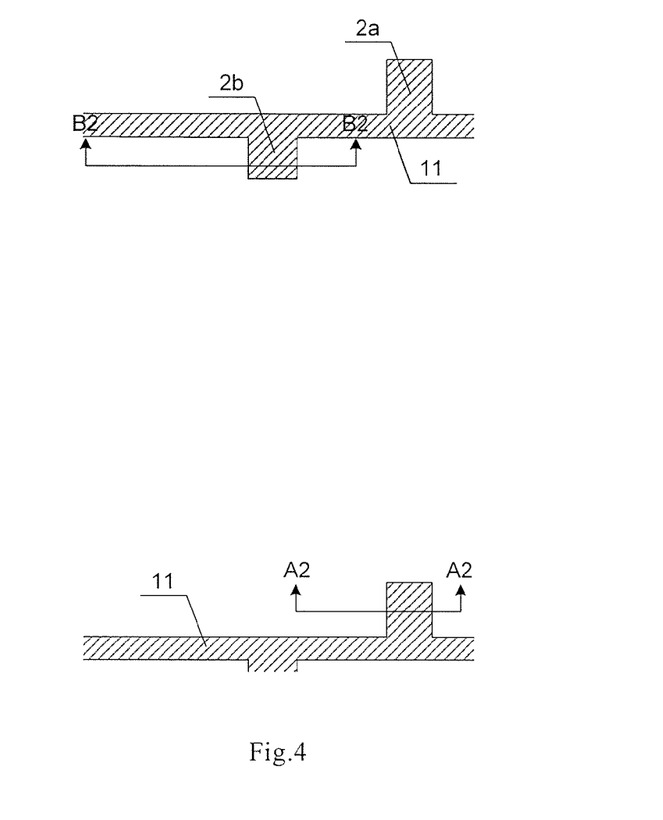
FIG. 4 is a plan view after a first patterning process in the first embodiment of the TFT-LCD array substrate according to the invention.
Figure 5:
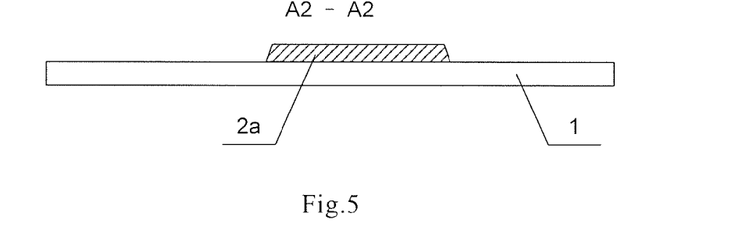
FIG. 5 is a sectional view taken along line A2-A2 in FIG. 4.
Figure 6:
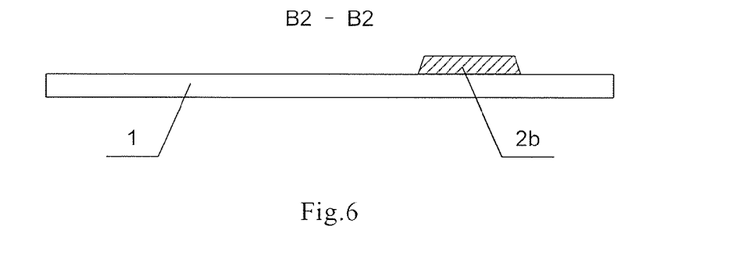
FIG. 6 is a sectional view taken along line B2-B2 in FIG. 4.

FIG. 4 is a plan view after a first patterning process in the first embodiment of the TFT-LCD array substrate according to the invention, in which only one pixel region is shown, FIG. 5 is a sectional view taken along line A2-A2 in FIG. 4, and FIG. 6 is a sectional view taken along line B2-B2 in FIG. 4.

Firstly, a first metal film is deposited on a substrate 1 (such as a glass substrate or a quartz substrate) by a magnetron sputtering method or a thermal evaporation method, and then the gate line 11, the first gate electrode 2a and the second gate electrode 2b are formed by a patterning process with a normal mask plate. The first gate electrode 2a and the second gate electrode 2b are connected with the gate line 11 and respectively provided in the pixel regions on both sides of the gate line 11, that is, the first gate electrode 2a is provided in the pixel region in certain pixel row (such as the n-th pixel row) and the second gate electrode 2b is provided in the pixel region in the next pixel row (such as the (n+1)-th pixel row), as shown in FIG. 4 to FIG. 6. In another embodiment, a common electrode line may be simultaneously formed in this patterning process, and the common electrode line overlaps the pixel electrode described later to provide storage capacitance.

Figure 7:
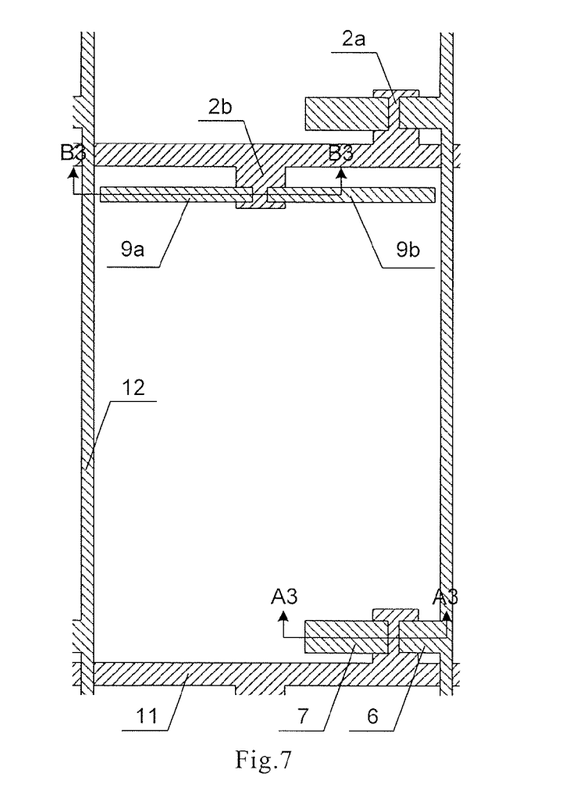
FIG. 7 is a plan view after a second patterning process in the first embodiment of the TFT-LCD array substrate according to the invention.
Figure 8:
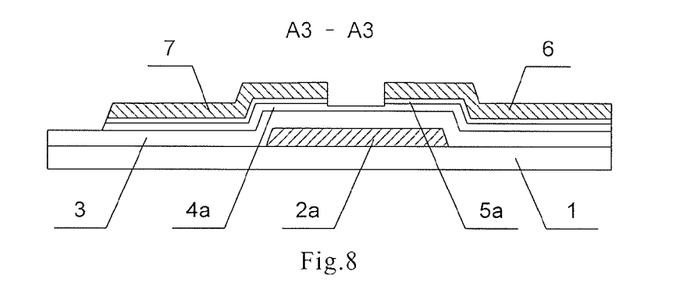
FIG. 8 is a sectional view taken along line A3-A3 in FIG. 7.
Figure 9:
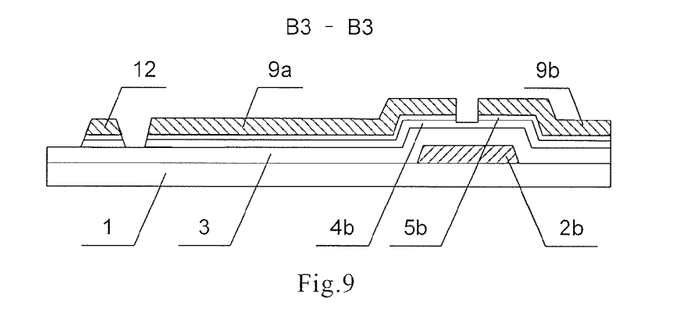
FIG. 9 is a sectional view taken along line B3-B3 in FIG. 7.

FIG. 7 is a plan view after a second patterning process in the first embodiment of the TFT-LCD array substrate according to the invention, in which only one pixel unit is shown, FIG. 8 is a sectional view taken along line A3-A3 in FIG. 7, and FIG. 9 is a sectional view taken along line B3-B3 in FIG. 7.

On the substrate with the pattern shown in FIG. 4, a gate insulating layer 3, a semiconductor film and a doped semiconductor film are sequentially deposited by a plasma enhanced chemical vapor deposition (PECVD) method, and then a second metal film is deposited by a magnetron sputtering method or a thermal evaporation method. The first active layer, the second active layer, the date line 12, the source electrode 6, the drain electrode 7, the first connection electrode 9a and the second connection electrode 9b are formed by a patterning process with a half-tone mask plate or a gray-tone mask plate. The first active layer, the source electrode 6 and the drain electrode 7 are formed in the pixel region with the first gate electrode 2a, and the second active layer, the first connection electrode 9a and the second connection electrode 9b are formed in the pixel region with the second gate electrode 2b as shown in FIG. 7 to FIG. 9. The first active layer comprises the stack of the first semiconductor film 4a and the first doped semiconductor film 5a. The first active layer is formed on the gate insulating layer 3 and positioned over the first gate electrode 2a. The source electrode 6 and the drain electrode 7 are formed on the first active layer. One end of the source electrode 6 is provided above the first gate electrode 2a, and the other end thereof is connected with the data line 12. One end of the drain electrode 7 is provided above the first gate electrode 2a opposite to the drain electrode 6. The first TFT channel region is formed between the source electrode 6 and the drain electrode 7. In the first TFT channel region, the first doped semiconductor film 5a is etched away and the first semiconductor film 4a is partially etched in the thickness direction thereof so that the first semiconductor film 4a in this region is exposed. The second active layer comprises the stack of the second semiconductor film 4b and the second doped semiconductor film 5b. The second active layer is formed on the gate insulating layer 3 and positioned over the second gate electrode 2b. The first connection electrode 9a and the second connection electrode 9b are formed on the second active layer. The end portion of the first connection electrode 9a opposite to the second connection electrode 9b and the end portion of the second connection electrode 9b opposite to the first connection electrode 9a are provided above the second gate electrode 2b. The second TFT channel region is formed between the first connection electrode 9a and the second connection electrode 9b. In the second TFT channel region, the second doped semiconductor film 5b is etched away and the second semiconductor film 4b is partially etched in the thickness direction thereof so that the second semiconductor film 4b in this region is exposed.

This patterning process is a process comprising multiple-etching steps. After depositing the gate insulating layer, the semiconductor film and the doped semiconductor film and then depositing the second metal film, a photoresist layer is applied on the second metal film. The photoresist layer is exposed with a half-tone mask plate or a gray-tone mask plate to form a completely exposed region, an unexposed region and a partially exposed region. The unexposed region corresponds to the regions of the data line, the source electrode, the drain electrode, the first connection electrode and the second connection electrode, which are to be formed; the partially exposed region corresponds to the regions of the first TFT channel and the second TFT channel, which are to be formed; and the completely exposed region corresponds to the region other than the above regions. After performing a developing process, the thickness of the photoresist in the unexposed region substantially is not changed, forming a photoresist-completely-retained region; the photoresist in the completely exposed region is completely removed, forming a photoresist-completely-removed region; and the thickness of the photoresist in the partially exposed region is decreased, forming a photoresist-partially-retained region. By an first etching process, the second metal film, the doped semiconductor film and the semiconductor film in the photoresist-completely-removed region are etched away to form the first active layer, the second active layer and the data line. By an ashing process, the photoresist layer in the photoresist-partially-retained region is removed to expose the second metal film in this region, and the photoresist in the photoresist-completely-retained region is reduced in thickness. By a second etching process, the exposed second metal film and the doped semiconductor film are etched away and the semiconductor film is partially etched in the thickness direction thereof to form the source electrode, the drain electrode, the first connection electrode, the second connection electrode, the first TFT channel region and the second TFT channel region. Then, the remaining photoresist in the photoresist-completely-retained region is removed to complete this patterning process.

Figure 10:
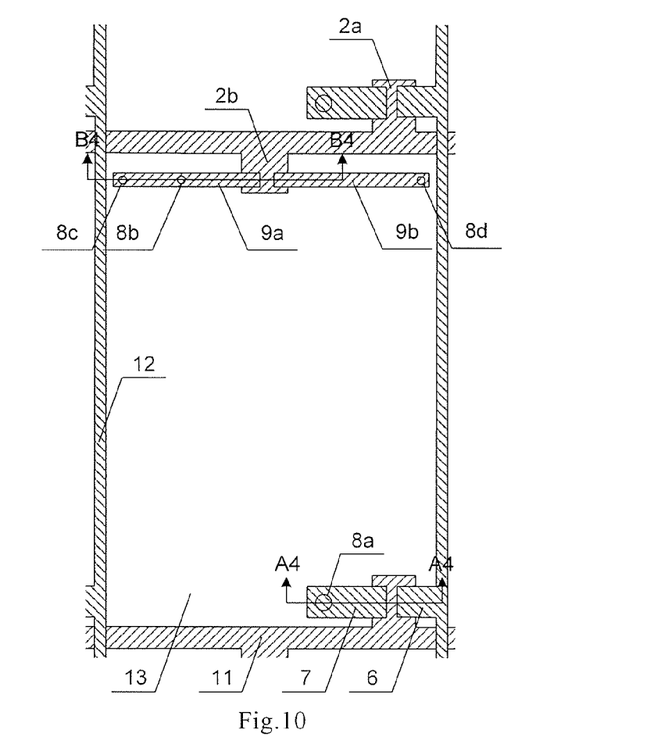
FIG. 10 is a plan view after a third patterning process in the first embodiment of the TFT-LCD array substrate according to the invention.
Figure 11:
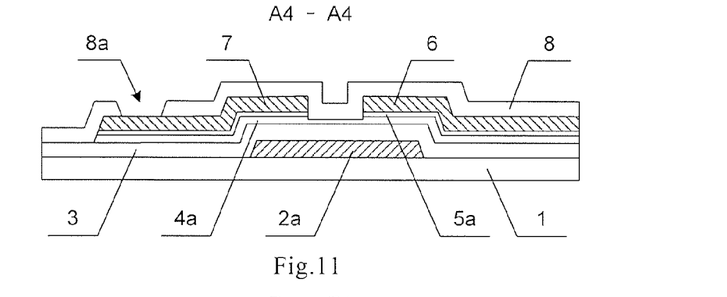
FIG. 11 is a sectional view taken along line A4-A4 in FIG. 10.
Figure 12:
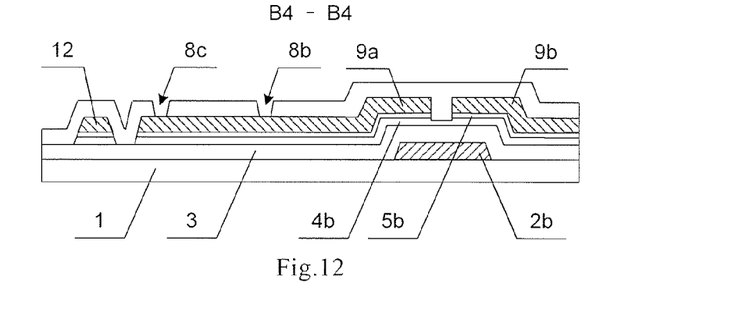
FIG. 12 is a sectional view taken along line B4-B4 in FIG. 10.

FIG. 10 is a plan view after a third patterning process in the first embodiment of the TFT-LCD array substrate according to the invention, in which only one pixel unit is shown, FIG. 11 is a sectional view taken along line A4-A4 in FIG. 10, and FIG. 12 is a sectional view taken along line B4-B4 in FIG. 10.

On the substrate with the structure shown in FIG. 7, the passivation layer 8 is deposited by a PECVD method, and then the first via hole 8a, the second via hole 8b, the third via hole 8c and the fourth via hole 8d in the passivation layer 8 are formed by a patterning process with a normal mask plate, as shown in FIG. 10 to FIG. 12. The first via hole 8a in the passivation layer is provided at the drain electrode 7, and the surface of the drain electrode 7 is exposed in the first via hole 8a. The second via hole 8b in the passivation layer is provided at the first connection electrode 9a (or the second connection electrode 9b), and the surface of the first connection electrode 9a (or the second connection electrode 9b) is exposed in the second via hole 8b. The third via hole 8c in the passivation layer is provided at the end portion of the first gate electrode 9a in the proximity of the data line 12. The fourth via hole 8d in the passivation layer is provided at the end portion of the second connection electrode 9b in the proximity of the data line 12. In this patterning process, a gate pad via hole may be formed in the gate pad region, and a data pad via hole may be formed in the data pad region. The shape and the manufacture process of the gate pad via hole and the data pad via hole are well-known in the art and detail descriptions thereof are omitted here for simplicity.

Finally, on the substrate with the pattern shown in FIG. 10, a transparent conductive film is deposited by a magnetron sputtering method or a thermal evaporation method, and then the pixel electrode and the third connection electrode 14 are formed by a patterning process with a normal mask plate. The pixel electrode 13 is formed in each pixel region. The pixel electrode 13 is connected with the drain electrode 7 through the first via hole 8a and connected with the first connection electrode 9a (or the second connection electrode 9b) through the second via hole 8b. The third connection electrode 14 is provided across adjacent two pixel regions in the same pixel row and connects the first connection electrode 9a and the second connection electrode 9b, which are respectively provided in the adjacent pixel regions, through the third via hole 8c and the fourth via hole 8d in the passivation layer, as shown in FIG. 1 to FIG. 3.

It should be noted that, the above-described structure and manufacture process of the TFT-LCD array substrate merely are exemplified, and modifications may be made. For example, the patterns formed in the second patterning process in this embodiment may be formed by using two normal mask plates, that is, the first active layer and the second active layer are formed by a patterning process using a normal mask plate, and the data line, the source electrode, the drain electrode, the first connection electrode and the second connection electrode are formed by a patterning process using another normal mask plate.

Figure 13:
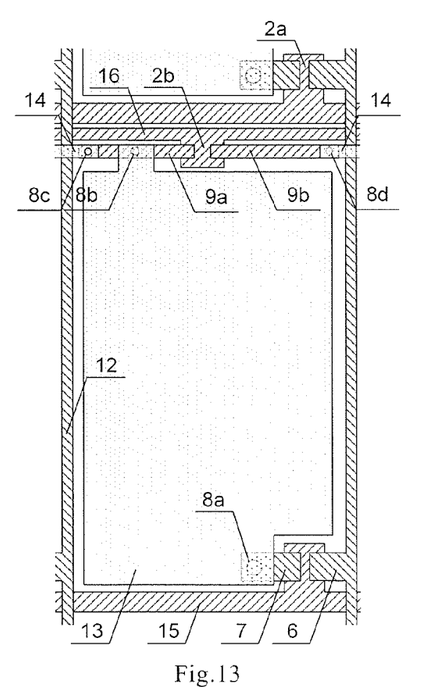
FIG. 13 is a plan view showing a second embodiment of a TFT-LCD array substrate according to the invention.

FIG. 13 is a plan view showing a second embodiment of a TFT-LCD array substrate according to the invention.

The second embodiment is a modification of the first embodiment, and the operation principle of the TFT-LCD array substrate in the second embodiment is similar to that in the first embodiment. The first thin film transistor and the second thin film transistor are connected with the gate lines adjacent to the corresponding pixel electrode, respectively. However, in this embodiment, two gate lines, i.e., an operation gate line 15 and a pre-charge gate line 16, are provided for one pixel row. The operation gate line 15 with a relatively large width is used to supply the controlling signal to the first thin film transistor as the operation switch. The pre-charge gate line 16 with a relatively small width is used to supply the controlling signal to the second thin film transistor as the discharge switch.

As shown in FIG. 13, the TFT-LCD array substrate in this embodiment comprises the operation gate line 15, the pre-charge gate line 16, the first gate electrode 2a and the second gate electrode 2b formed on the substrate. The first gate electrode 2a is connected with the operation gate line 15, and the second gate electrode 2b is connected with the pre-charge gate line 16. In a former pixel row and a latter pixel row adjacent to each other, the operation gate line 15 is provided for the pixel regions in the former pixel row (such as the n-th pixel row), the pre-charge gate line 16 is provided for the pixel regions in the latter pixel row (such as the (n+1)-th pixel row), and in this case, the operation gate line 15 and the pre-charge gate line 16 are connected with each other or operate simultaneously. If the n-th pixel row is regarded as the current pixel row, the n-th operation gate line corresponding to n-th pixel row is regarded as the current operation gate line, and the n-th pre-charge gate line corresponding to the n-th pixel row is regarded as the current pre-charge gate line, the (n−1)-th operation gate line corresponding to the (n−1)-th pixel row is regarded as the previous operation gate line, and the (n+1)-th pre-charge gate line corresponding to the (n+1)-th pixel row is regarded as the next pre-charge gate line. The current operation gate line and the current pre-charge gate line are respectively provided on the upper side and the lower side of the current pixel row. The current operation gate line and the pre-charge gate line in the next pixel row (i.e., the next pre-charge gate line) are connected with each other or operate simultaneously, and the current pre-charge gate line and the operation gate line in the previous pixel row (i.e., the previous operation gate line) are connected with each other or operate simultaneously. That is, if the current pixel row correspond to the n-th operation gate line 15 and the n-th pre-charge gate line 16, the n-th pre-charge gate line 16 is connected with the (n−1)-th operation gate line 15 and the n-th operation gate line 15 is connected with the (n+1)-th pre-charge gate line 16. The gate insulating layer is formed on the operation gate line 15, the pre-charge gate line 16, the first gate electrode 2a and the second gate electrode 2b and covers the entirety of the substrate. The structures of the first active layer, the second active layer, the source electrode, the drain electrode, the first TFT channel region, the first connection electrode, the second connection electrode, the second TFT channel region and the data line are similar to those in the first embodiment.

In the TFT-LCD array substrate according to this embodiment, when the ON signal is supplied to the n-th operation gate line, the ON signal is simultaneously supplied to the adjacent (n+1)-th pre-charge gate line, and in this case, the first thin film transistors connected with the n-th operation gate line and the second thin film transistors connected with the (n+1)-th pre-charge gate line begin to operate simultaneously. The source electrode and drain electrode of the first thin film transistor as the operation switch are electrically connected so that the pixel electrodes in the n-th pixel row corresponding to the n-th operation gate line are charged, and at the same time, the first connection electrode and the second connection electrode of the second thin film transistor as the discharge switch are electrically connected so that the pixel electrodes in the (n+1)-th pixel row corresponding to the (n+1)-th pre-charge gate line are connected with each other, that is, the pixel electrodes in the (n+1)-th pixel row are pre-charged.

The manufacture process of the TFT-LCD array substrate in this embodiment is similar to that in the first embodiment except for the first patterning process. In the first patterning process of this embodiment, the first metal film is deposited on the substrate by a magnetron sputtering method or a thermal evaporation method, the operation gate line, the pre-charge gate line, the first gate electrode and the second gate electrode are formed by a patterning process with a normal mask plate. The first gate electrode is connected with the operation gate line, and the second gate electrode is connected with the pre-charge gate line. In the former pixel row and the latter pixel row adjacent to each other, the operation gate line is provided for the pixel regions of the former pixel row, the pre-charge gate line is provided for the pixel regions of the latter pixel row, and in this case, the operation gate line and the pre-charge gate line are connected with each other or operate simultaneously. In other words, in a pixel row, the operation gate line and the pre-charge gate line are respectively provided on the upper side and the lower side of the pixel row, and in this case, the operation gate line and the pre-charge gate line in the next pixel row are connected with each other or operate simultaneously, and the pre-charge gate line and the operation gate line in the previous pixel row are connected with each other or operate simultaneously.

Figure 14:
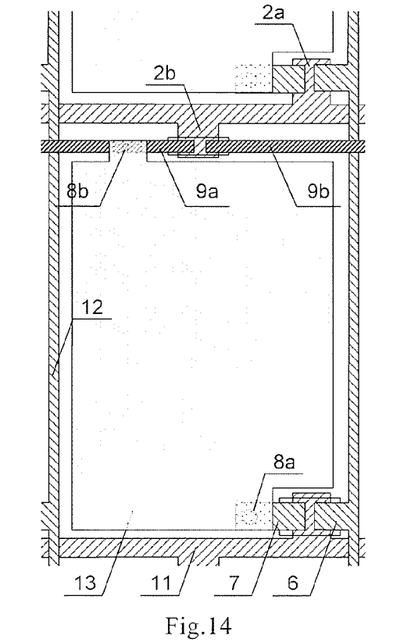
FIG. 14 is a plan view showing a third embodiment of a TFT-LCD array substrate according to the invention.

FIG. 14 is a plan view showing a third embodiment of a TFT-LCD array substrate according to the invention.

The third embodiment is a modification of the first embodiment, and the operation principle of the TFT-LCD array substrate in the third embodiment is similar to that in the first embodiment. However, in the third embodiment, the data line 12, the source electrode 6 and the drain electrode 7 are provided in a layer, and the first connection electrode 9a and the second connection electrode 9b are provided in another layer which is different from the layer where the data line 12, the source electrode 6 and drain electrode 7 are formed.

As shown in FIG. 14, the gate line, the first gate electrode 2a and the second gate electrode 2b are formed on the substrate. The first gate electrode 2a and the second gate electrode 2b are connected with the gate line 11 and respectively provided on both sides of the gate line 11. That is, if the first gate electrode 2a is provided in the pixel region in the n-th pixel row, the second gate electrode 2b is provided in the pixel region in the adjacent (n+1)-th pixel row. The gate insulating layer is formed on the gate line 11, the first gate electrode 2a and the second gate electrode 2b and covers the entirety of the substrate. The first active layer and the second active layer are formed on the gate insulating layer. The first active layer is provided over the first gate electrode 2a, and the second active layer is provided over the second gate electrode 2b. The source electrode 6 and the drain electrode 7 are formed on the first active layer. On end of the source electrode 6 is provided above the first gate electrode 2a, and the other end thereof is connected with the data line 12. One end of the drain electrode 7 is provided above the first gate electrode 2a, and the other end thereof is connected with the pixel electrode 13. The first TFT channel region is formed between the source electrode 6 and the drain electrode 7. An insulating layer in formed on the data line 12, and the insulating layer is used to prevent the data line 12 from being electrically connected with the first connection electrode 9a and the second connection electrode 9b to be formed, and thus the insulating layer may be merely formed in the region where the data line 12 overlaps with the first connection electrode 9a and the second connection electrode 9b. Then, the first connection electrode 9a and the second connection electrode 9b are formed on the above patterns. One end of the first connection electrode 9a is provided above the second gate electrode 2b (on the second active layer), and the other end thereof is directly connected with the second connection electrode 9b in the adjacent pixel region on one side in the same pixel row. One end of the second connection electrode 9b is provided above the second gate electrode 2b (on the second active layer), and the other end thereof is directly connected with first connection electrode 9a in the adjacent pixel region one the other side in the same pixel row. The second TFT channel region is formed between the first connection electrode 9a and the second connection electrode 9b. The first gate electrode 2a, the first active layer, the source electrode 6 and the drain electrode 7 constitute the first thin film transistor as the operation switch, and the first thin film transistor is formed in the pixel region in the n-th pixel row. The second gate electrode 2b, the second active layer, the first connection electrode 9a and the second connection electrode 9b constitute the second thin film transistor as the discharge switch, the second thin film transistor is provided in the pixel region in the adjacent (n+1)-th pixel row. The passivation layer is formed on the above patterns and covers the entirety of the substrate. The first via hole 8*a* in the passivation layer is provided at the drain electrode 7, the second via hole 8*b* in the passivation layer is provided at the first connection electrode 9*a* (or the second connection electrode 9*b*). The pixel electrode 13 is formed on the passivation layer. The drain electrode 7 of the first thin film transistor as the operation switch is connected via the first via hole 8*a* in the passivation layer with the pixel electrode 13 in the pixel region in the n-th pixel row, and the first connection electrode 9*a* (or the second connection electrode 9*b*) of the second thin film transistor as the discharge switch is connected via the second via hole 8*b* in the passivation layer with the pixel electrode 13 in the pixel region in the adjacent (n+1)-pixel row.

The manufacture process of the TFT-LCD array substrate in this embodiment is described as follows. (1) the first metal film is deposited on the substrate by a magnetron sputtering method or a thermal evaporation method, the gate line, the first gate electrode and the second gate electrode are formed by a patterning process with a normal mask plate, the first gate electrode and the second gate electrode are connected with the gate line and respectively provided in the pixel regions on both sides of the gate line, that is, if the first gate electrode is provided in the pixel region in the n-th pixel row, the second pixel electrode 2*b* is provided in the pixel region in the adjacent (n+1)-th pixel row; (2) the gate insulating layer, the semiconductor film and the doped semiconductor film are sequentially deposited by a PECVD method, the first active layer and the second active layer are formed by a patterning process with a normal mask plate, the first active layer comprises the stack of the first semiconductor film and the first doped semiconductor film and is formed on the gate insulating layer and positioned over the first gate electrode, the second active layer comprises the stack of the second semiconductor film and the second doped semiconductor film and is formed on the gate insulating layer and positioned over the second gate electrode; (3) the second metal film is deposited on the substrate by a magnetron sputtering method or a thermal evaporation method, the data line, the source electrode, the drain electrode and the first channel region are formed by a patterning process with a normal mask plate, one end of the source electrode is provided on the first active layer and the other end thereof is connected with the data line, one end of the drain electrode is provided on the first active layer and opposite to the source electrode, the first channel region is formed between the source electrode and the drain electrode; (4) the insulating layer is deposited by a PECVD method to at least cover the data line, or preferably, the insulating layer is patterned by a patterning process with a normal mask plate so that the insulating layer at least is remained on the data line, since the insulating layer is used to prevent the data line from being electrically connected with the first connection electrode and the second connection electrode to be formed, the insulating layer may be merely formed in region where the data line overlaps with the first connection electrode and the second connection electrode; (5) a third metal layer is deposited on the substrate by a magnetron sputtering method or a thermal evaporation method, the first connection electrode, the second connection electrode and the second TFT channel region are formed by a patterning process with a normal mask plate, one end of the first connection electrode is provided on the second active layer and the other end thereof is directly connected with the second connection electrode in the adjacent pixel region on one side, one end of the second connection electrode is provided on the second active layer and the other end thereof is directly connected with the first connection electrode in the adjacent pixel region on the other side, the second TFT channel region is formed between the first connection electrode and the second connection electrode; (6) the passivation layer is deposited by a PECVD method, the first via hole and the second via hole in the passivation layer are formed by a patterning process with a normal mask plate, the first via hole in the passivation layer is provided at the drain electrode, and the second via hole in the passivation layer is provided at the first connection electrode (or the second connection electrode); (7) the transparent conductive film is deposited by a magnetron sputtering method or a thermal evaporation method, the pixel electrode is formed by a patterning process with a normal mask plate, the pixel electrode is connected with the drain electrode through the first via hole and connected with the first connection electrode (or the second connection electrode) through the second via hole.

The number of the patterning process in this embodiment is more than that in the first embodiment. However, in this embodiment, since the first connection electrode and the second connection electrode in the adjacent pixel regions are directly connected with each other and both the first TFT channel region and the second TFT channel region are formed by a patterning process with a normal mask plate, the product quality can be ensured.

Figure 15:
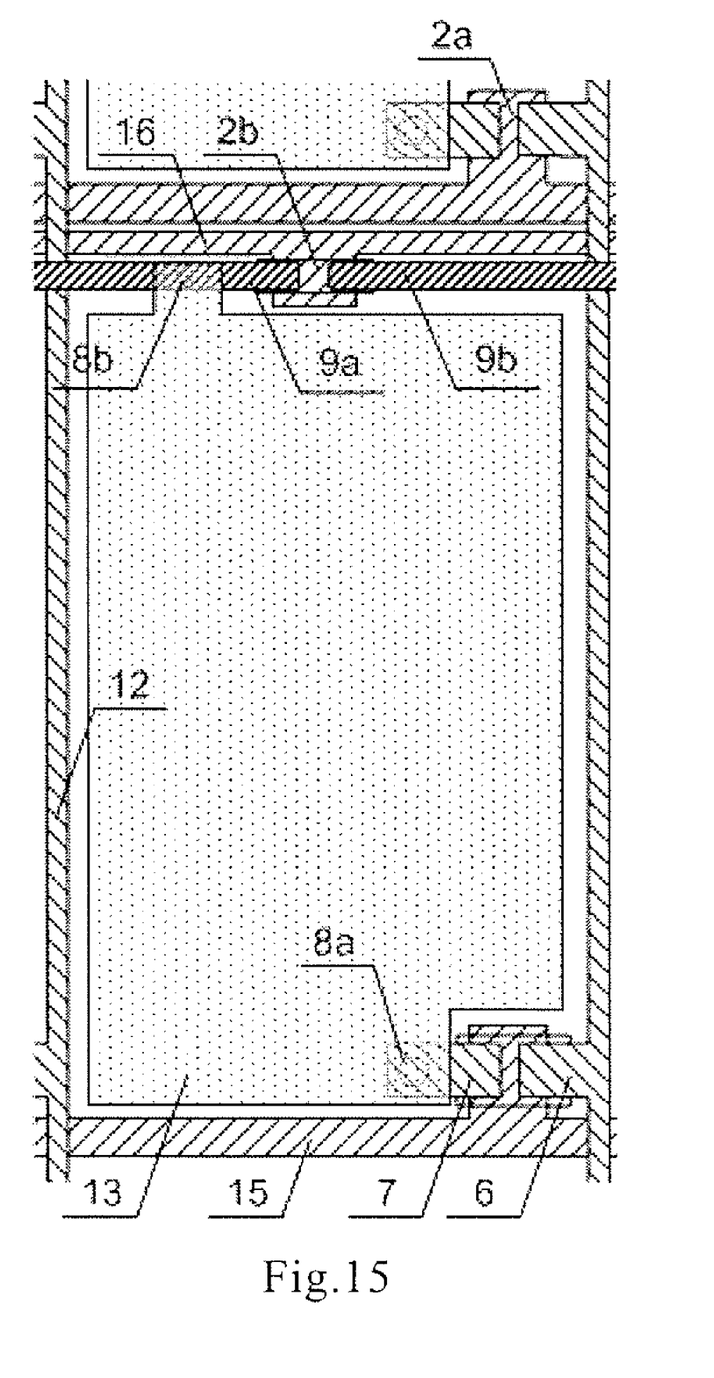
FIG. 15 is a plan view showing a fourth embodiment of a TFT-LCD array substrate according to the invention.

FIG. 15 is a plan view showing a fourth embodiment of a TFT-LCD array substrate according to the invention.

As shown in FIG. 15, the fourth embodiment is a modification of the second embodiment or of the third embodiment. The TFT-LCD array substrate in this embodiment is different from that in the second embodiment in that the first connection electrode 9*a* and the second connection electrode 9*b* are formed in the layer different from the layer of the data lien 12, the source electrode 6 and the drain electrode 7. The TFT-LCD array substrate in the this embodiment is different from that in the third embodiment in that the operation gate line 15 and the pre-charge gate line 16 are formed in the pixel region. As to the details of the structure and the manufacture process of the TFT-LCD array substrate in this embodiment, the above descriptions of the first to third embodiments can be referred to, and thus the detailed description of this embodiment is omitted for simplicity.

In the TFT-LCD array substrate according to the embodiments of the invention, the first thin film transistor for charging the pixel electrode and the second thin film transistor for pre-charging the pixel electrode are formed in each pixel region, and thus, when the pixel electrode in a pixel row is charged, the pixel electrode in the adjacent next pixel row is pre-charged. In this way, the voltage drop between the current frame and the next frame of each pixel electrode is shortened, and the large variation of voltage in the polarity reversal mode is eliminated. Thus, the charge-and-discharge time can be shortened and the power consumption can be decreased.

A first embodiment of a method of manufacturing a TFT-LCD array substrate according to the invention may comprise the following steps.

Step 11, depositing a first metal film on a substrate, forming a gate line, a first gate electrode and a second gate electrode by a patterning process, wherein the first gate electrode and the second gate electrode are connected with the gate line and respectively provided in pixel regions on both sides of the gate line;

Step 12, sequentially depositing a gate insulating layer, a semiconductor film, a doped semiconductor film and a second metal film, forming a first active layer, a second active layer, a data line, a source electrode, a drain electrode, a first connection electrode and a second connection electrode by a patterning process;

Step 13, depositing a pssivation layer, forming a first via hole, a second via hole, a third via hole and a fourth via hole in the passivation layer, wherein the first via hole in the passivation layer is provided at the drain electrode, the second via hole of the pssivation layer is provided at the first connection electrode or the second connection electrode, the third via hole of the passivation layer is provided at an end portion of the first connection electrode, and the fourth via hole in the passivation layer is provided at an end portion of the second connection electrode; and Step 14, depositing a transparent conductive film, and forming a pixel electrode and a third connection electrode by a patterning process, wherein the pixel electrode is connected with the drain electrode through the first via hole in the passivation layer and connected with the first connection electrode or the second connection electrode through the second via hole in the passivation layer, the first connection electrode and the second connection electrode in adjacent two pixel regions are connected with each other by the third connection electrode through the third via hole and the fourth via hole in the passivation layer.

Two examples of the Step 11 in this embodiment are described as follows. In the first example, the first metal film is deposited on the substrate by a magnetron sputtering method or a thermal evaporation method, the gate line, the first gate electrode and the second gate electrode are formed by a patterning process with a normal mask plate, the first gate electrode and the second gate electrode are connected with the gate line and respectively provided in the pixel regions on both sides of the gate line. In the second example, the first metal film is deposited on the substrate by a magnetron sputtering method or a thermal evaporation method, an operation gate line, a pre-charge gate line, the first gate electrode and the second gate electrode are formed by a patterning process with a normal mask plate, the first gate electrode is connected with the operation gate line, the second gate electrode is connected with the pre-charge gate line, the first gate electrode and the second gate electrode are provided in the pixel regions on both sides of the operation gate line. In the first example, the operation gate line and the pre-charge gate line in the second example are combined into one gate line.

The step 12 in this embodiment may be performed as follows. The gate insulating layer, the semiconductor film and the doped semiconductor film are sequentially deposited by a PECVD method, the second metal film is deposited by a magnetron sputtering method or a thermal evaporation method, and then a photoresist layer is deposited on the second metal film. The photoresist layer is exposed by using a half-tone mask plate or a gray-tone mask plate to form a photoresist-completely-removed region, a photoresist-completely-retained region and a photoresist-partially-retained region. The photoresist-completely-retained region corresponds to the regions of the data line, the source electrode, the drain electrode, the first connection electrode and the second connection electrode, which are to be formed; the photoresist-partially-retained region corresponds to the region of the first TFT channel and the second TFT channel, which are to be formed; and the photoresist-completely-removed region corresponds to the region other than the above regions. After a developing process is performed, the thickness of the photoresist in the photoresist-completely-retained region is not changed, the photoresist in the photoresist-completely-removed region is completely removed, and the thickness of the photoresist in the photoresist-partially-retained region is decreased. The second metal film, the doped semiconductor film and the semiconductor film in the photoresist-completely-removed region is etched away by a first etching process to form the first active layer, the second active layer and the data line. By an ashing process, the photoresist in the photoresist-partially-retained region is removed to expose the second metal film in this region, and the photoresist in the photoresist-completely-retained region is reduced in thickness. In the photoresist-partially-retained region, the second metal film and the doped semiconductor film are etched away and the semiconductor film is partially etched in the thickness direction thereof by a second etching process to form the source electrode, the drain electrode, the first connection electrode, the second connection electrode, the first TFT channel region and the second TFT channel region. Finally, the remained photoresist in the photoresist-completely-retained region is removed.

The Step 13 may be performed as follows. The passivation layer is deposited on by a PECVD method, the first via hole, the second via hole, the third via hole and the fourth via hole in the passivation layer are formed by a patterning process with a normal mask plate. The first via hole in the passivation layer is provided at the drain electrode, the second via hole in the passivation layer is provided at the first connection electrode or the second connection electrode, the third via hole of the passivation layer is provided at the end portion of the first connection electrode, and the fourth via hole is provided at the end portion of the second connection electrode.

The Step 14 may be performed as follows. The transparent conductive film is deposited by a magnetron sputtering method or a thermal evaporation method, and the pixel electrode and the third connection electrode are formed by a patterning process with a normal mask plate. The pixel electrode is connected with the drain electrode through the first via hole and connected with the first connection electrode or the second connection electrode through the second via hole. The first connection electrode and the second connection electrode are connected with each other by the third connection electrode through the third via hole and the fourth via hole in the passivation layer.

In the embodiment, the first connection electrode and the second connection electrode are provided in the same layer as that of the data line and formed by a same patterning process as that of the data line, and the details of this embodiment haven been described with reference to FIG. 4 to FIG. 12.

A second embodiment of a method of manufacturing a TFT-LCD array substrate according to the invention comprises the following steps.

Step 21, depositing a first metal film on a substrate, forming a gate line, a first gate electrode and a second gate electrode by a patterning process, wherein the first gate electrode and the second gate electrode are connected with the gate line and respectively provided in pixel regions on both sides of the gate line;

Step 22, sequentially depositing a gate insulating layer, a semiconductor film and a doped semiconductor film, and forming a first active layer and a second active layer by a patterning process;

Step 23, depositing a second metal layer, and forming a data line, a source electrode, a drain electrode and a first TFT channel region by a patterning process;

Step 24, depositing an insulating layer, and forming a pattern of the insulating layer by a patterning process;

Step 25, depositing a third metal film, and forming a first connection electrode, a second connection electrode and a second TFT channel region by a patterning process;

Step 26, depositing a passivation layer, and forming a first via hole and a second via hole in the passivation layer by a patterning process, wherein the first via hole in the passivation layer is provided at the drain electrode, and the second via hole in the passivation layer is provided at the first connection electrode or the second connection electrode;

Step 27, depositing a transparent conductive film, and forming a pixel electrode by a patterning process, wherein the pixel electrode is connected with the drain electrode through the first via hole in the passivation layer and connected with the first connection electrode or the second connection electrode through the second via hole in the passivation layer.

Two examples of the Step 21 in this embodiment are described as follows. In the first example, the first metal film is deposited on the substrate by a magnetron sputtering method or a thermal evaporation method, the gate line, the first gate electrode and the second gate electrode are formed by a patterning process with a normal mask plate, the first gate electrode and the second gate electrode are connected with the gate line and respectively provided in the pixel regions on both sides of the gate line. In the second example, the first metal film is deposited on the substrate by a magnetron sputtering method or a thermal evaporation method, an operation gate line, a pre-charge gate line, the first gate electrode and the second gate electrode are formed by a patterning process with a normal mask plate, the first gate electrode is connected with the operation gate line, the second gate electrode is connected with the pre-charge gate line, the first gate electrode and the second gate electrode are provided in the pixel regions on both sides of the operation gate line. In the first example, the operation gate line and the pre-charge gate line in the second example are combined into one gate line.

The Step 22 may be performed as follows. The gate insulating layer, the semiconductor film and the doped semiconductor film are sequentially deposited by a PECVD method, and the first active layer and the second active layer are formed by a patterning process with a normal mask plate. The first active layer comprises the stack of the first semiconductor film and the first doped semiconductor film and is formed on the gate insulating layer and positioned over the first gate electrode, the second active layer comprises the stack of the second semiconductor film and the second doped semiconductor film and is formed on the gate insulating layer and positioned over the second gate electrode The Step 23 may be performed as follows. The second metal film is deposited on the substrate by a magnetron sputtering method or a thermal evaporation method, the data line, the source electrode, the drain electrode and the first channel region are formed by a patterning process with a normal mask plate. One end of the source electrode is provided on the first active layer, and the other end thereof is connected with the data line. One end of the drain electrode is provided on the first active layer and opposite to the source electrode. The first channel region is formed between the source electrode and the drain electrode.

The Step 24 may be performed as follows. The insulating layer is deposited by a PECVD method and the pattern of the insulating layer is formed by a patterning process with a normal mask plate.

The Step 25 may be performed as follows. The third metal layer is deposited on the substrate by a magnetron sputtering method or a thermal evaporation method, the first connection electrode, the second connection electrode and the second TFT channel region are formed by a patterning process with a normal mask plate. One end of the first connection electrode is provided on the second active layer and the other end thereof is directly connected with the second connection electrode in the adjacent pixel region on one side. One end of the second connection electrode is provided on the second active layer and the other end thereof is directly connected with the first connection electrode in the adjacent pixel region on the other side. The second TFT channel region is formed between the first connection electrode and the second connection electrode.

The Step 26 may be performed as follows. The passivation layer is deposited by a PECVD method, the first via hole and the second via hole in the passivation layer are formed by a patterning process with a normal mask plate. The first via hole in the passivation layer is provided at the drain electrode, and the second via hole in the passivation layer is provided at the first connection electrode or the second connection electrode.

The Step 27 may be performed as follows. The transparent conductive film is deposited by a magnetron sputtering method or a thermal evaporation method, the pixel electrode is formed by a patterning process with a normal mask plate. The pixel electrode is connected with the drain electrode through the first via hole and connected with the first connection electrode or the second connection electrode through the second via hole.

In this embodiment, the first connection electrode and the second connection electrode are provided in the layer different from that of the date line, both the first TFT channel region and the second TFT channel region are formed by a patterning process with normal mask plate, and thus the product quality can be ensured.

According to the method of manufacturing the TFT-LCD array substrate in the embodiment of the invention, the first thin film transistor for charging the pixel electrode and the second thin film transistor for pre-charging the pixel electrode are formed in each pixel region, and thus, when the pixel electrode in a pixel row is charged, the pixel electrode in the adjacent next pixel row is pre-charged. In this way, the voltage drop between the current frame and the next frame of each pixel electrode is shortened, and the large variation of voltage in the polarity reversal mode is eliminated. Thus, the charge-and-discharge time can be shortened and the power consumption can be decreased.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A thin film transistor liquid crystal display (TFT-LCD) array substrate comprising:
   a plurality of gate lines and a plurality of data lines formed on a substrate, and
   a plurality of pixel regions defined by the gate lines and the data lines,
   wherein a pixel electrode, a first thin film transistor for controlling the charge of the pixel electrode and a second thin film transistor for controlling the pre-charge of the pixel electrode are formed in each pixel region,
   wherein for each pixel region, the gate line comprising an operation gate line and a pre-charge gate line, the first thin film transistor is connected with the operation gate line, and the second thin film transistor is connected with the pre-charge gate line, and
   wherein the second thin film transistor comprises a second gate electrode, a first connection electrode and a second connection electrode, the second gate electrode is connected with the pre-charge gate line, one end of the first connection electrode is provided above the second gate electrode and the other end thereof is connected with the second connection electrode in an adjacent pixel region on one side, one end of the second connection electrode is provided above the second gate electrode and the other end thereof is connected with the first connection electrode in an adjacent pixel region on the other side, and the first connection electrode or the second connection electrode is connected with the pixel electrode.

2. The TFT-LCD array substrate according to claim 1, wherein the pre-charge gate line is parallel to and operates simultaneously with the operation gate line in a previous pixel row.

3. The TFT-LCD array substrate according to claim 1, wherein the operation gate line is parallel to and connected with the pre-charge gate line in a previous pixel row.

4. The TFT-LCD array substrate according to claim 1, wherein for each pixel region, two gate lines adjacent to the pixel electrode are respectively defined as the operation gate line and the pre-charge gate line, and the pre-charge gate line is also used as the operation gate line in a previous pixel row.

5. The TFT-LCD array substrate according to claim 1, wherein the second gate electrode is formed on the substrate, an gate insulating layer covers the second gate electrode, an second active layer is formed on the gate insulating layer and positioned over the second gate electrode, a second TFT channel region is formed between the first connection electrode and the second connection electrode, a passivation layer is formed on the second thin film transistor, a second via hole is provided in the passivation layer, the second via hole is used to connect the first connection electrode or the second connection electrode with the pixel electrode.

6. The TFT-LCD array substrate according to claim 5, wherein the first connection electrode and the second connection electrode are provided in the same layer as that of the data line, a third via hole and a fourth via hole are further provided in the passivation layer, a third connection electrode is provided in the same layer as that of the pixel electrode, the first connection electrode is connected with the second connection electrode in an adjacent pixel region on one side in a same pixel row by the third connection electrode through the third via hole of the passivation layer, and the second connection electrode is connected with the first connection electrode in an adjacent pixel region on the other side in the same pixel row by the third connection electrode through the fourth via hole in the passivation layer.

7. The TFT-LCD array substrate according to claim 5, wherein the first connection electrode and the second connection electrode are formed on an insulating layer covering the date line, the first connection electrode is directly connected with the second connection electrode in an adjacent pixel region in a same pixel row.

* * * * *